United States Patent [19]

Feng et al.

[11] Patent Number: 4,473,939
[45] Date of Patent: Oct. 2, 1984

[54] PROCESS FOR FABRICATING GAAS FET WITH ION IMPLANTED CHANNEL LAYER

[75] Inventors: Milton Feng, Rancho Palos Verdes; Victor K. Eu, Redondo Beach; Hilda Kanber, Rolling Hills Estates, all of Calif.

[73] Assignee: Hughes Aircraft Company, El Segundo, Calif.

[21] Appl. No.: 453,251

[22] Filed: Dec. 27, 1982

[51] Int. Cl.³ .......................................... H01L 21/324
[52] U.S. Cl. .................................. 29/571; 29/576 B; 148/1.5; 148/189
[58] Field of Search ............... 29/571, 576 B; 148/1.5, 148/189

[56] References Cited

U.S. PATENT DOCUMENTS

| | | | |
|---|---|---|---|
| 4,058,413 | 11/1977 | Welch et al. | 148/187 X |
| 4,244,097 | 1/1981 | Cleary | 29/576 B |
| 4,265,934 | 5/1981 | Ladd | 148/1.5 X |
| 4,357,180 | 11/1982 | Molnar | 148/175 X |
| 4,383,869 | 5/1983 | Liu | 148/1.5 |
| 4,396,437 | 8/1983 | Kwok et al. | 29/576 B |

OTHER PUBLICATIONS

Kasahara et al., "Capless Anneal of Ion-Implanted GaAs in Controlled Arsenic Vapor, *J. Appl. Phys.*, 50 (1), Jan. 1979, pp. 541-543.

Primary Examiner—G. Ozaki
Attorney, Agent, or Firm—J. Holtrichter, Jr.; A. W. Karambelas

[57] ABSTRACT

There is herein described a process for fabricating GaAs FETs with an ion implanted channel layer wherein an ion implanted substrate is capless annealed under an arsine overpressure, and a relatively shallow portion of the outer surface of the substrate in the active layer is removed for the deposition of a gate metallic electrode.

12 Claims, 4 Drawing Figures

PROCESS FOR FABRICATING GAAS FET WITH ION IMPLANTED CHANNEL LAYER

BACKGROUND OF THE INVENTION

1. Field of the Invention

This invention relates generally to the field of ion implanted semiconductor materials and more particularly to techniques for producing MESFET devices.

2. Description of the Prior Art

Ion implantation technology has been used for GaAs FET channel formation over the past several years. However, devices made using ion implanted channels have demonstrated inconsistent RF and DC performance. This is because the quality of the channel layer strongly depends on the properties of the semi-insulating substrate, which contains high levels of impurities such as chromium. It is also known that redistribution of impurities takes place when the substrate is heat treated to anneal out the implantation damage.

In spite of inconsistent results associated with the use of ion implantation for the formation of the active channel, this technique provides a number of advantages. These include the possibility of planar type device and circuit technology, good uniformity of the channel layers and economy. For the microwave discrete devices, monolithic integrated circuits and digital integrated circuits, ion implantation continues to offer significant advantages over other technologies. Recently, quarter-micron gate length FET devices have been reported with a noise figure of 1.9 dB and 7 dB associated gain at 18 GHz. Other reports indicate that a noise figure of 1.3 dB with an associated gain of 10 to 11 dB at 12 GHz have been achieved. In all cases, these devices have been fabricated with deeply recessed gate structures (0.3 $\mu$m) on 0.5 $\mu$m thick active channel layers over high quality buffer layers grown by $AsCl_3$/liquid Ga/$H_2$ vapor phase epitaxy (VPE).

As an advancement in the art, the present invention provides extremely low-noise and low-cost GaAs MESFETs fabricated by new ion implantation techniques without deeply recessed gate structures. The best performance (to date) includes a 1.3 dB noise figure with 10.3 dB associated gain at 12 GHz and a noise figure of 2.3 dB with an associated gain of 7.4 dB at 18 GHz.

SUMMARY OF THE INVENTION

In view of the foregoing factors and conditions characteristic of the prior art, it is a primary object of the present invention to provide a new and improved method for making GaAs FET devices having an ion implanted channel layer.

Another object of the present invention is to provide a high yield method for manufacturing GaAs FETs having uniform RF and DC, and very low-noise characteristics.

Still another object of the present invention is to provide a technique suitable for large scale production of GaAs FETs having noise figure averages around 1.6 dB and 10 dB associated gain at about 12 GHz.

Yet another object of the present invention is to provide a technique for producing GaAs FETs having single wafer uniformity and excellent wafer-to-wafer reproducibility.

Still a further object of the present invention is to provide GaAs FETs with suitable application for LNFET, power FET and monolithic integrated circuits.

Yet a further object of the present invention is to provide a GaAs FET configuration that is not substrate sensitive.

In accordance with the present invention, a process for fabricating GaAs FETs with an ion implanted channel layer includes the steps of providing a semi-insulating GaAs substrate; implanting n-type ions through a surface of the substrate to produce an n-type active layer in the substrate; capless annealing the substrate under $AsH_3$ overpressure in a non-reactive gas to a predetermined elevated temperature sufficient to remove substantial amounts of ion implantation damage in the substrate and to electrically activate the active layer, the overpressure being approximately 100 times that of the equilibrium $As_4$ pressure of the GaAs at the aforementioned elevated temperature. The process also includes the steps of depositing source and drain ohmic contract metalizations on the surface of the substrate in spaced relationship; removing a relatively shallow portion of the outer surface of the substrate in the active layer intermediate the source and drain contact metalizations for a gate electrode contact; and depositing a gate metalization in the shallow removed portion.

The substrate may also be provided with a high resistivity buffer layer into which the n-type ions are implanted. The ions may be implanted with energy between 80 to 140 KeV and a dose between $4 \times 10^{12}$ ions/cm$^2$ to $7 \times 10^{12}$ ions/cm$^2$ fluence. Further, the annealing temperature may be between 820° to 890° C., and the gate electrode recess in the outer surface of the active layer between 400 to 800 Å deep.

The features of the present invention which are believed to be novel are set forth with particularity in the appended claims. The present invention, both as to its organization and manner of operation together, with further objects and advantages thereof, may best be understood by making reference to the following description taken in conjunction with the accompanying drawings in which like reference characters refer to like elements in the several views.

DETAILED DESCRIPTION OF THE INVENTION

Figure 1A:
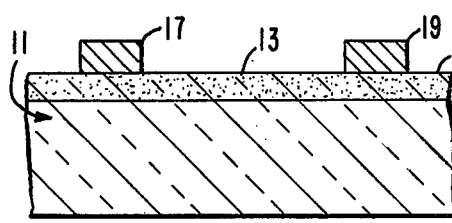
FIGS. 1a through 1c illustrate a preferred process sequence according to the present invention.
Figure 1B:
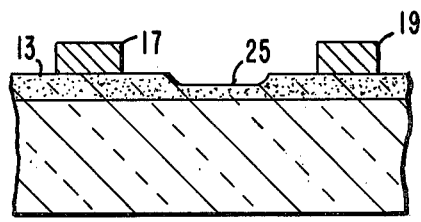
Figure 1C:
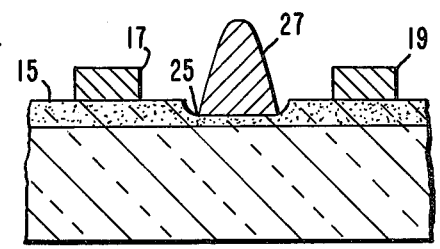

Referring now to the drawings and more particularly to FIGS. 1a through 1c, there is shown in FIG. 1a a semi-insulating GaAs substrate or an undoped high resistivity buffer layer over a GaAs substrate 11 wherein an ion implanted channel layer 13 of approximately 1200 Å deep has been provided in the upper area of the substrate 11. Disposed on the upper surface 15 of the substrate is a source ohmic contact or electrode 17 and a spaced drain ohmic contact or electrode 19.

The implanted GaAs channel layer 13 is provided in the substrate by conventional ion implantation of n-type ions such as silicon or sulfur ions from about 60 KeV to about 140 KeV, and a dose between $3 \times 10^{12}$ ions/cm$^2$ to about $7 \times 10^{12}$ ions/cm$^2$, to a depth of about 0.1 $\mu$m/100 KeV.

The substrate 11 is then placed in an annealing furnace without a conventional cap layer of SiO$_2$ wherein it is heated to a temperature between 800° and 1000° C. for about 20 to 30 minutes. The substrate is annealed in an ambient mixture of arsine gas (AsH$_3$) and flowing H$_2$, where the arsine p=0.021 atm. This value is an overpressure of about 100 times greater than the equilibrium As pressure at the annealing temperature. The annealing step helps remove lattice damage and increase electrical activity in the ion implanted region and prevent the dissociation of As$_4$ outdiffusion from GaAs without any stress effect as seen in the prior art cap annealing method.

Once source and drain contact metalizations 17 and 19 have been alloyed into the substrate surface 15, the surface between these metalizations is recess-etched a relatively small amount, of the order of 400 to 800 Å, as shown in FIG. 1b. This shallow recess 25 provides for higher device yield than that obtainable using a relatively deeper recess. Also, this configuration provides greater uniformity relative to drain-to-source current, and further enhances microwave performance over that obtainable in devices having relatively deeper recesses.

Finally, a gate ohmic contact 27 is deposited in the recess 25, as shown in FIG. 1c. In this embodiment, the gate is aluminum defined by direct write E-beam and its length is about 0.5 μm, while the gate width is about 300 μm.

Figure 2:
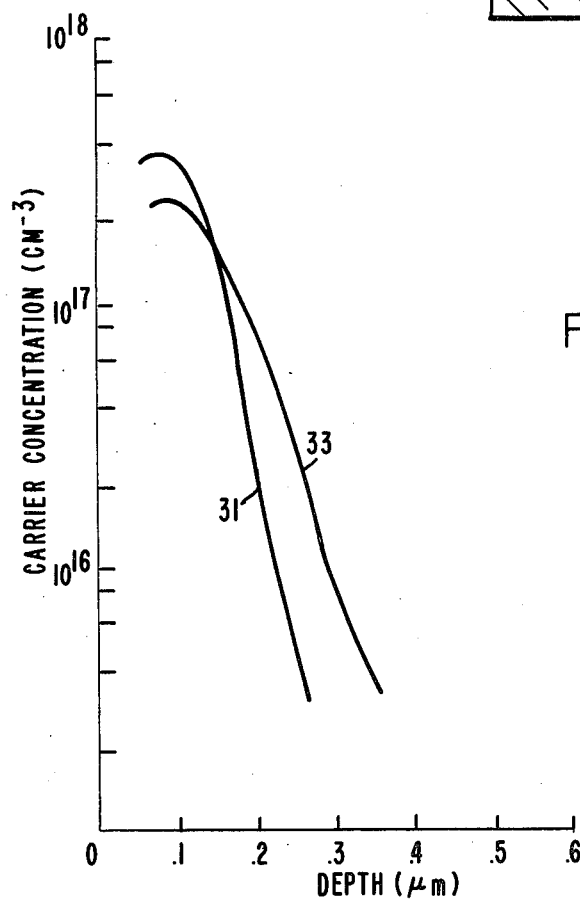
FIG. 2 is a graphic representation showing a comparison of electrical profiles comparing a capped implant with the capless implant process according to the invention.

The above-described process produces a GaAs FET structure exhibiting an electrical profile such as shown at curve 31 in the graph of FIG. 2. This characteristic is compared with that of SiO$_2$ capped structure otherwise processed in a similar manner, represented by curve 33. Both structures used 100 KeV 7×10$^{12}$ ions/cm$^2$ Si+ implants in GaAs upon respective capless and SiO$_2$ capped annealing, as described previously. It can clearly be seen that the slope of curve 31 is equal to 550 Å, while curve 33, representing the capped structure, has a slope equal to 1040 Å.

From the foregoing, it should be evident that the invention provides a high yield method for manufacturing GaAs FETs having uniform RF and DC, and very low-noise characteristics. Also, the inventive technique is suitable for large scale production of GaAs FETs having noise figure averages around 1.6 dB and 10 dB associated gain at about 12 GHz.

What is claimed is:

1. A process for fabricating a GaAs FET with ion implanted channel layer including the steps of:
    (a) providing a semi-insulating GaAs substrate;
    (b) implanting n-type ions through a surface of said substrate to produce an n-type active layer in said substrate;
    (c) capless annealing said substrate under AsH$_3$ overpressure in a non-reactive gas to a predetermined elevated temperature sufficient to remove substantial amounts of ion implantation damage in said substrate and to electrically activate said active layer, said overpressure being approximately 100 times that of the equilibrium As$_4$ pressure of said GaAs at said elevated temperature;
    (d) depositing source and drain ohmic contact metalizations on said surface of said substrate in spaced relationship;
    (e) removing a relatively shallow portion of the outer surface of said substrate in said active layer intermediate said source-and-drain contact metalizations for a gate electrical contact; and
    (f) depositing a gate metalization in said shallow removed portion.

2. The process for fabricating a GaAs FET according to claim 1, wherein said non-reactive gas is H$_2$.

3. The process for fabricating a GaAs FET according to claim 1, wherein said gate metalization is aluminum.

4. The process for fabricating a GaAs FET according to claim 1, wherein the depth of said relatively shallow portion is approximately 400 Å to 800/Å.

5. The process for fabricating a GaAs FET according to claim 1, wherein said predetermined temperature is between about 800° C. and 1000° C.

6. The process for fabricating a GaAs FET according to claim 1, wherein the partial pressure of said AsH$_3$ equals about 0.021 atm.

7. A process for fabricating a GaAs FET with ion implanted channel layer including the steps of:
    (a) providing a semi-insulating GaAs substrate;
    (b) providing an undoped high resistivity buffer layer over said substrate;
    (c) implanting n-type ions through a surface of said buffer layer to produce an n-type active layer in said buffer layer;
    (d) capless annealing said buffer layer and said substrate under AsH$_3$ overpressure in a non-reactive gas to a predetermined elevated temperature sufficient to remove substantial amounts of ion implantation damage in said buffer layer and to electrically activate said active layer, said overpressure being approximately 100 times that of the equilibrium As$_4$ pressure of said As at said elevated temperature;
    (e) depositing source-and-drain ohmic contact metalizations on said surface of said buffer layer in spaced relationship;
    (f) removing a relatively shallow portion of the outer surface of said buffer layer in said active layer intermediate said source-and-drain contact metalizations for a gate electrical contact; and
    (g) depositing a gate metalization in said shallow removed portion.

8. The process for fabricating a GaAs FET according to claim 7, wherein said non-reactive gas is H$_2$.

9. The process for fabricating a GaAs FET according to claim 7, wherein said gate metalization is aluminum.

10. The process for fabricating a GaAs FET according to claim 7, wherein the depth of said relatively shallow portion is approximately 400 Å to 800/Å.

11. The process for fabricating a GaAs FET according to claim 7, wherein said predetermined temperature is between about 800° C. and 1000° C.

12. The process for fabricating a GaAs FET according to claim 7, wherein the partial pressure of said AsH$_3$ equals about 0.021 atm.

* * * * *